United States Patent
Wilson et al.

(10) Patent No.: US 11,360,133 B2
(45) Date of Patent: Jun. 14, 2022

(54) SINUSOIDAL HARMONIC NULLING

(71) Applicant: Hamilton Sundstrand Corporation, Charlotte, NC (US)

(72) Inventors: Michael A. Wilson, Scottsdale, AZ (US); Gary L. Hess, Somers, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 227 days.

(21) Appl. No.: 16/722,257

(22) Filed: Dec. 20, 2019

(65) Prior Publication Data

US 2021/0190840 A1 Jun. 24, 2021

(51) Int. Cl.
| G01R 23/20 | (2006.01) |
| G01D 5/22 | (2006.01) |
| G01D 5/20 | (2006.01) |
| G01R 19/02 | (2006.01) |

(52) U.S. Cl.
CPC ........... *G01R 23/20* (2013.01); *G01D 5/2073* (2013.01); *G01D 5/2291* (2013.01); *G01R 19/02* (2013.01)

(58) Field of Classification Search
CPC ...... G01D 5/204; G01D 21/00; G01D 5/2073; G01D 5/2291; G01D 3/02; G01D 5/22; G01D 5/20; G01R 19/02; G01R 23/20; G01R 27/32; G01R 27/28; G01R 1/07; G01R 23/16; H03M 1/00
See application file for complete search history.

(56) References Cited

U.S. PATENT DOCUMENTS

| 3,575,616 A | 4/1971 | Jordan |
| 4,893,261 A | 1/1990 | Flint et al. |
| 6,094,989 A | 8/2000 | Twerdochlib |
| 10,168,248 B1 | 1/2019 | Morey et al. |
| 2012/0010849 A1* | 1/2012 | Yamada ............... G01D 5/2073 702/151 |
| 2017/0227567 A1* | 8/2017 | Son ......................... G06F 13/28 |
| 2019/0113551 A1 | 4/2019 | Stenberg |
| 2020/0011708 A1* | 1/2020 | Hess .................... G01D 5/2291 |

FOREIGN PATENT DOCUMENTS

| DE | 102017101746 A1 | 8/2017 |
| DE | 102018211179 A1 | 1/2019 |
| EP | 2754998 A1 | 9/2014 |

OTHER PUBLICATIONS

EP Search Report; dated Apr. 12, 2021; Application No. 20208056.0; Filed: Nov. 17, 2020; 7 pages.
Shang-Teh et al., "Five-Point Amplitude Estimation of Sinusoidal Signals: With Application to LVDT Signal Conditioning," IEEE Transactions on Instrumentation and Measurement, vol. 59, No. 3, Mar. 2010, pp. 623-630.

* cited by examiner

*Primary Examiner* — Jermele M Hollington
*Assistant Examiner* — Suresh K Rajaputra
(74) *Attorney, Agent, or Firm* — Cantor Colburn LLP

(57) ABSTRACT

Systems, methods, and computer program products for sinusoidal nulling are provided. Aspects include transmitting, by a controller, an excitation signal to a first sensor, determining, by the controller, a target harmonic based at least on one or more characteristics of the excitation signal, receiving a return signal from the first sensor, sampling the return signal at a first sample rate based on the target harmonic, and adjusting a phase of the sampled return signal to null the target harmonic amplitude to form an adjusted return signal.

14 Claims, 4 Drawing Sheets

SINUSOIDAL HARMONIC NULLING

BACKGROUND

The present invention generally relates to aircraft sensors, and more specifically, to sinusoidal harmonic nulling of signals from aircraft sensors.

Modern aircraft have a plurality of control surfaces, systems, actuators, torques, temperatures, and the like which need to be monitored to ensure proper operation of the aircraft In order to be able to monitor the various aircraft parameters, sensors are used on the individual control surfaces, actuators, and engines to detect the various parameters. The values detected by the sensors can subsequently be employed for instrumentation, used to generate control commands, and for various diagnostics. With diagnostic applications, the values detected by the sensors may be compared with predetermined values for a given parameter under selected conditions and a malfunction can be identified in the event a deviation is detected by the respective sensor from the predetermined values.

A variety of sensors may be employed depending on the application. Rotary or Linear Variable Differential Transformer sensors (RVDT or LVDT sensors), synchros and resolvers are conventionally used as sensors in aircraft. However, when sensors are used to detect various aircraft parameters, the sensors typically provide sensor signals that are sinusoidal in nature. These sensors often require an excitation voltage and then returns a sinusoidal return signal. However, these return signals which are utilized in determining characteristics of the aircraft include undesirable harmonic content.

SUMMARY

Embodiments of the present disclosure are directed to a method for sinusoidal nulling. A non-limiting example of the method includes transmitting, by a controller, an excitation signal to a first sensor, determining, by the controller, a target harmonic based at least on one or more characteristics of the excitation signal, receiving a return signal from the first sensor, sampling the return signal at a first sample rate based on the target harmonic, and adjusting a phase of the sampled return signal to null the target harmonic amplitude to form an adjusted return signal.

Embodiments of the present disclosure are directed to system for sinusoidal nulling. A non-limiting example of the system includes transmitting, by a controller, an excitation signal to a first sensor, determining, by the controller, a target harmonic based at least on one or more characteristics of the excitation signal, receiving a return signal from the first sensor, sampling the return signal at a first sample rate based on the target harmonic, and adjusting a phase of the sampled return signal to null the target harmonic amplitude to form an adjusted return signal.

Embodiments of the present disclosure are directed to computer program product for sinusoidal nulling. A non-limiting example of the computer program product includes a non-transitory computer readable medium with instruction embedded therein, the instructions operable to cause a processor to perform transmitting, by a controller, an excitation signal to a first sensor, determining, by the controller, a target harmonic based at least on one or more characteristics of the excitation signal, receiving a return signal from the first sensor, sampling the return signal at a first sample rate based on the target harmonic, and adjusting a phase of the sampled return signal to null the target harmonic amplitude to form an adjusted return signal.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Figure 1:
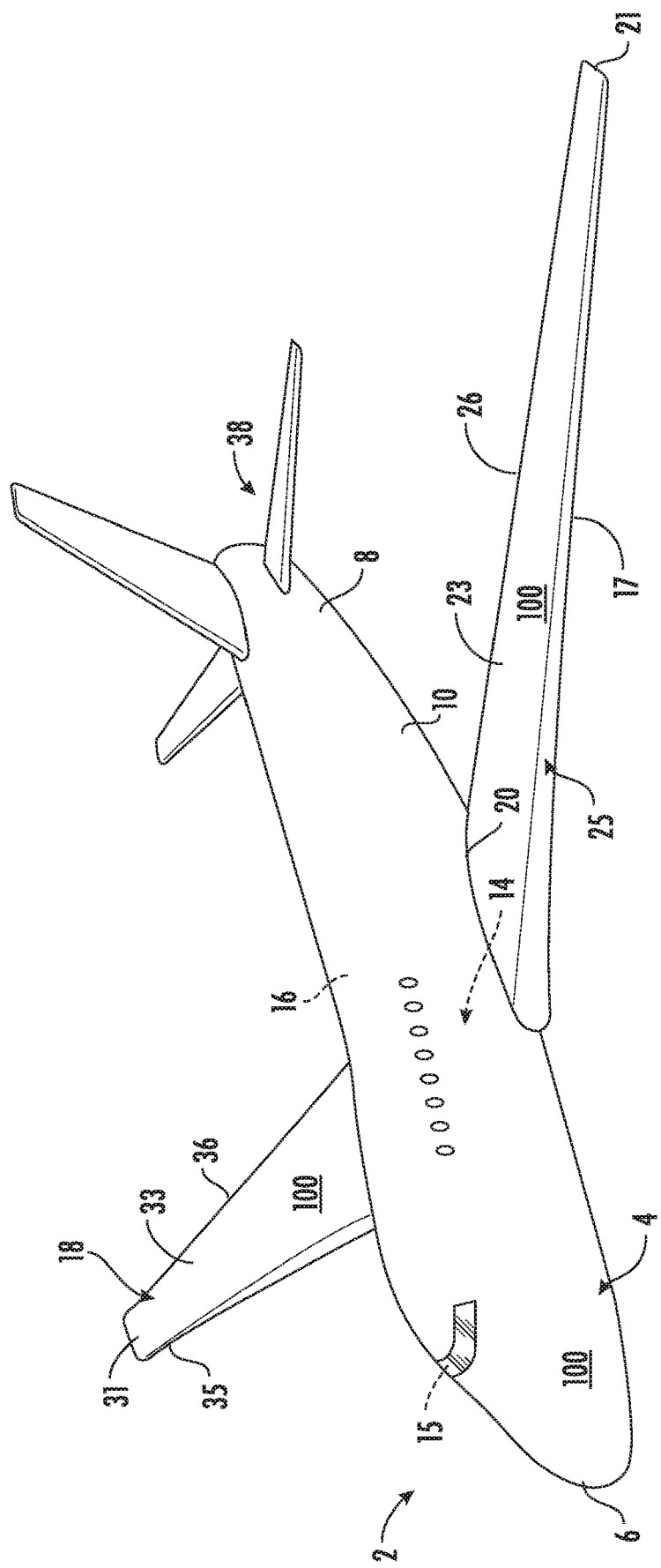
FIG. 1 is a perspective view of an aircraft that may incorporate embodiments of the present disclosure.

Referring now to the figures, FIG. 1 depicts a perspective view of an aircraft 2 that may incorporate embodiments of the present disclosure. Aircraft 2 includes a fuselage 4 extending from a nose portion 6 to a tail portion 8 through a body portion 10. Body portion 10 houses an aircraft cabin 14 that includes a crew compartment 15 and a passenger or cargo compartment 16. Body portion 10 supports a first wing 17 and a second wing 18. First wing 17 extends from a first root portion 20 to a first tip portion 21 through a first airfoil portion 23. First airfoil portion 23 includes a leading edge 25 and a trailing edge 26. Second wing 18 extends from a second root portion (not shown) to a second tip portion 31 through a second airfoil portion 33. Second airfoil portion 33 includes a leading edge 35 and a trailing edge 36. Tail portion 8 includes a stabilizer 38. Aircraft 2 includes an engine 54 configured to provide propulsion to the aircraft 2. The aircraft 2 also includes one or more aviation sensors 100 utilized to determine characteristics of the aircraft 2 or the flight or environmental characteristics.

Turning now to an overview of technologies that are more specifically relevant to aspects of the invention, many modern avionics control system require the measurement of sensor signals on an aircraft. These sensor signals, often, are sinusoidal in nature (i.e., having a periodic oscillation). These sinusoidal signals typically contain undesirable harmonic content. This undesirable harmonic content is sometimes referred to as harmonic distortion. Harmonic distortion adds harmonics that are integer multiples of a sinusoidal signal frequency. Harmonic distortion may be expressed in terms of the relative strength of individual components, in decibels, or the root mean square (RMS) of all harmonic components: total harmonic distortion, as a percentage. Now, total harmonic distortion (THD) is a measurement of the harmonic distortion present in a signal and is defined as the ratio of the sum of the powers of all harmonic components to the power of the fundamental frequency. The sensors, in aircraft, do not behave linearly at harmonic frequencies, so this harmonic content increases the overall sensor error. Existing systems attempt to minimize harmonic content by filtering the sinusoidal excitation source. However, these filtering requirements can be relaxed utilizing aspects of the present disclosure.

In one or more embodiments, by oversampling the sinusoidal signals from the sensors at a specific rate, the combined root mean squared (RMS) value of the fundamental frequency and a single harmonic frequency can be measured more precisely. The sampling phase offset can then be adjusted such that the sampled amplitude of the harmonic signal is nulled, leaving only a precise measurement of the fundamental sinusoid. This process allows for lower-cost excitation circuitry with less aggressive filtering to be used, since the THD caused by the presence of the third harmonic will no longer cause an issue. This could also be utilized to precisely measure the amplitude of a given harmonic for designs where required.

Figure 2:
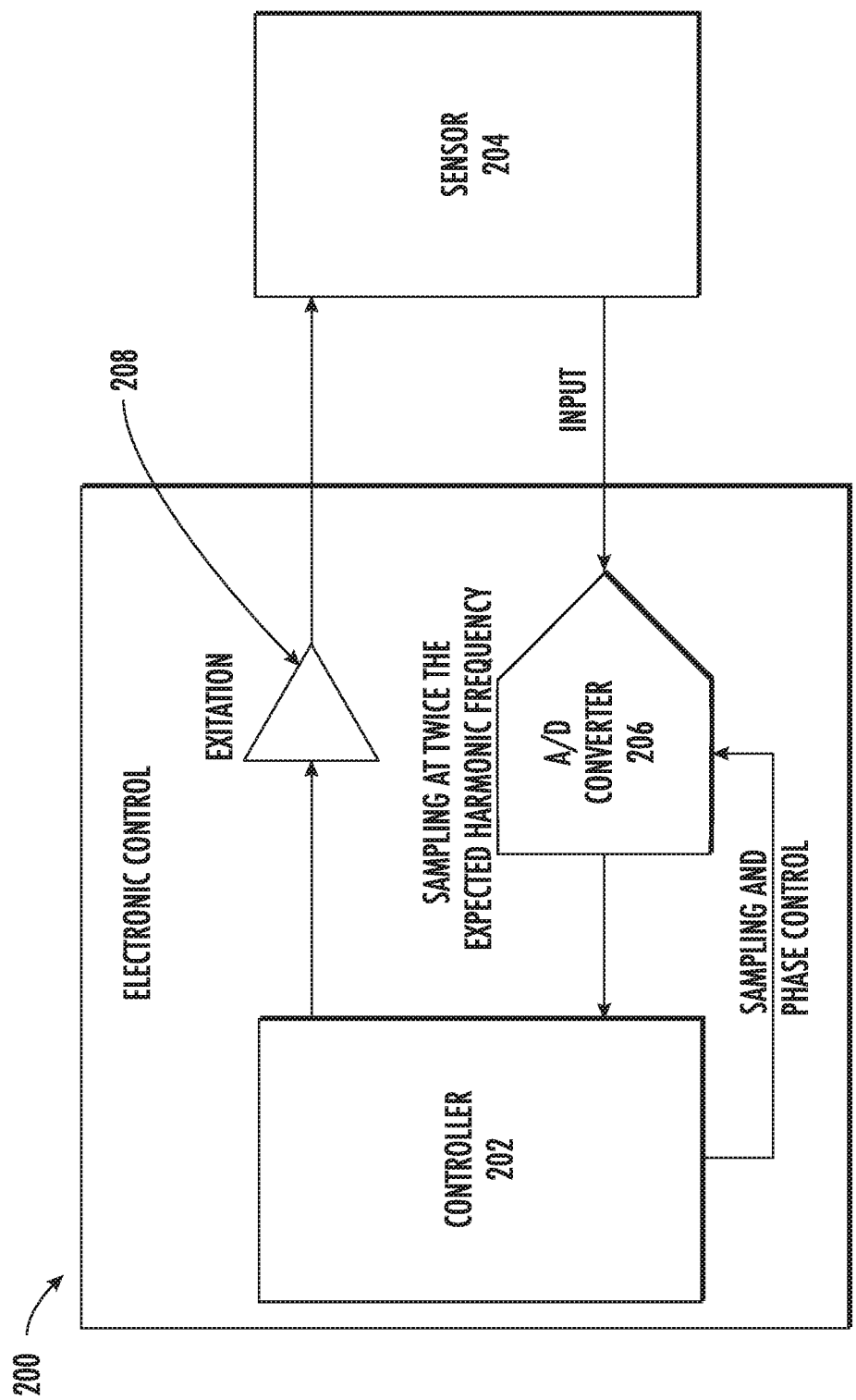
FIG. 2 depicts a block diagram of a system for sinusoidal nulling for aircraft sensors according to one or more embodiments.

FIG. 2 depicts a block diagram of a system for harmonic nulling for aircraft sensors according to one or more embodiments. The electronic control system 200 includes a controller 202, an analog to digital (A/D) converter 206 circuit, and an excitation circuit 208. The electronic control system 200 is in electronic communication with at least one sensor 204. The sensor 204 can be any type of aviation sensor including, but not limited to, a linear variable differential transformer (LVDT) sensor, a resolver, and a proximity sensor. This sensor 204 is configured to receive a sinusoidal excitation voltage from the excitation circuit 208. The sensor 204 then provides a sinusoidal return input which is then fed into the A/D converter 206. The controller 202 is configured to operate both the excitation circuit 208 and the A/D converter 206 and receive input form the A/D converter 206. As mentioned above, the sinusoidal return input signal received from these sensor 204 typically contains undesirable harmonic content, usually from the sensor excitation circuit 208 itself and because the sensor 204 does not behave linearly at harmonic frequencies, the harmonic content can increase the sensor error.

Figure 3A:
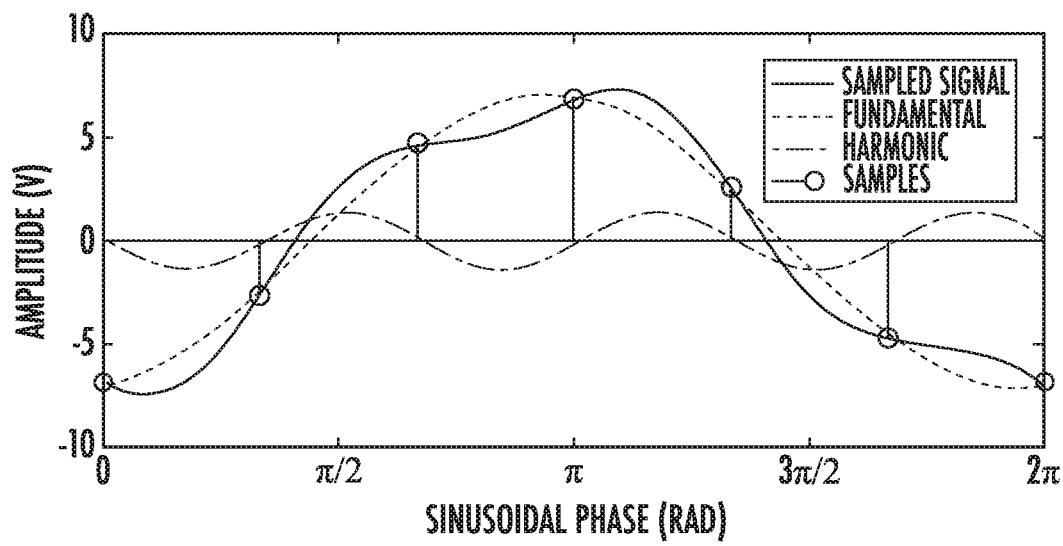
FIGS. 3a and 3b depict sampling occurring when a harmonic waveform samples are at zero according to one or more embodiments.
Figure 3B:
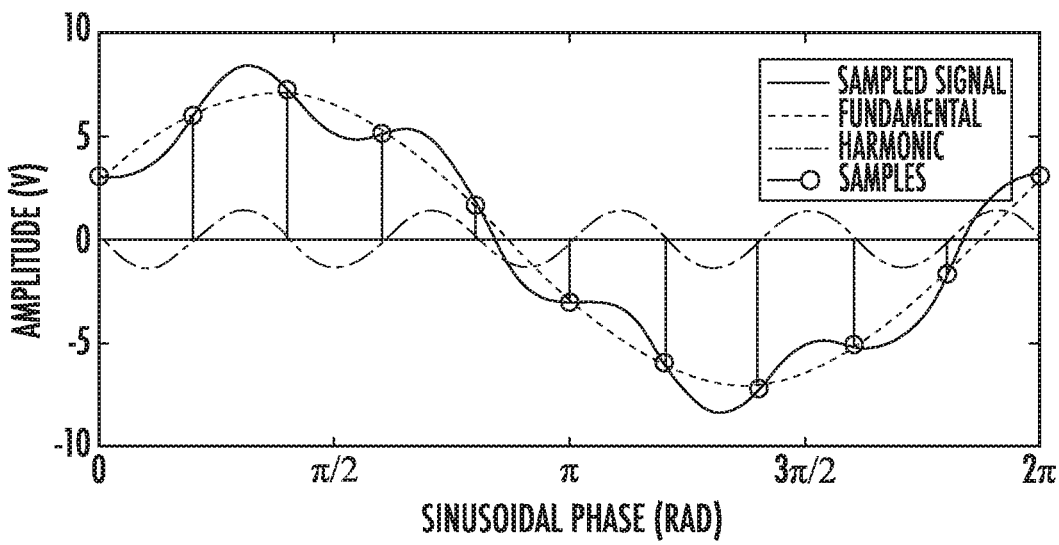

In one or more embodiments, the controller 202 operates the excitation circuit 208 to provide (transmit) a sinusoidal excitation voltage (signal) to the sensor 204 and the sensor 204 returns a sinusoidal return input to the A/D converter 206. The sinusoidal return input is modulated in some manner based on characteristics of the sensor 204. For example, in an LVDT sensor, the amplitude of the excitation voltage is modulated and this modulation is measures to determine sensor information for the sensor 204. LVDT sensors typically measure position and can be utilized in an aircraft application. In one or more embodiments, the controller 202 operates the A/D converter 206 to sample the sinusoidal return input from the sensor 204. The sampling of the sinusoidal return input is performed at a specific rate which is based on a target harmonic for nulling. The target harmonic is an integer multiple of the fundamental frequency of the excitation signal. The target harmonic is determined based on determining the dominant harmonic expected in the sinusoidal return signal from the sensor 204. The dominant harmonic based on the excitation circuit 208 implementation. In embodiments where a square wave is filtered to produce a sinusoid, for example, the third harmonic would be dominant (i.e., the target harmonic for nulling) based on the spectral content of a square wave. Also, the dominant harmonic would be determined ahead of time based on the design of the system. In one or more embodiments, the target harmonic is utilized to determine the sampling rate which is two (2) times the harmonic frequency of the target harmonic. For example, to null the third harmonic (target), the sample rate is six (6) times the fundamental frequency of the excitation voltage signal. That is to say, the harmonic frequency of the third harmonic is three times the fundamental frequency f. The sample rate is thus two (2) times three (3) times the fundamental frequency f or 6*f. The condition above also allows for the fundamental RMS amplitude to be measured exactly when calculated from N samples spanning one full period of the fundamental using the definition of RMS as described in greater detail in Equation 1 below.

$$v_{rms} = \sqrt{\frac{\sum_{i=0}^{N-1} v_i^2}{N}} \quad \text{Equation 1}$$

Where $v_{rms}$ is the root mean squared voltage. N is the number of samples and $v_i$ is the voltage amplitude measured at each sample spanning the full period of the sinusoid at the fundamental frequency. This is true for any integer number $N \geq 3$ of samples per period of a sinusoid. FIGS. 3a and 3b depict sampling occurring when a harmonic waveform samples are at zero according to one or more embodiments. The graph 300a in FIG. 3a depicts, more specifically, for a sinusoidal return input where the $3^{rd}$ harmonic is being nulled. The graph 300a a sinusoidal return input ("sampled signal") having a 5 $V_{rms}$ sinusoid with a 1 $V_{rms}$ $3^{rd}$ harmonic at an arbitrary phase offset with respect to the fundamental frequency of the excitation signal. The total RMS amplitude is 5.1 $V_{rms}$. By sampling at exactly six (6) times the fundamental frequency and adjusting the sampling phase offset such that the calculated amplitude is minimal, the controller 202 can see just the fundamental amplitude only because the third harmonic is nulled. The phase offset coincides with points on the sinusoid where the harmonic waveform samples are all at zero. FIG. 3b includes graph 300b showing a sinusoidal return input ("sampled signal") having a 5 $V_{rms}$ sinusoid with a 1 $V_{rms}$ 5th harmonic (labelled as "Harmonic") at an arbitrary phase offset with respect to the fundamental frequency of the excitation signal. The total RMS amplitude is 5.1 $V_{rms}$. By sampling at exactly ten (10) times the fundamental frequency and adjusting the sampling phase offset such that the calculated amplitude is minimal, the controller 202 can see just the fundamental amplitude because the fifth harmonic is nulled.

The phase offset coincides with points on the sinusoid where the harmonic waveform samples are all at zero.

Figure 4:
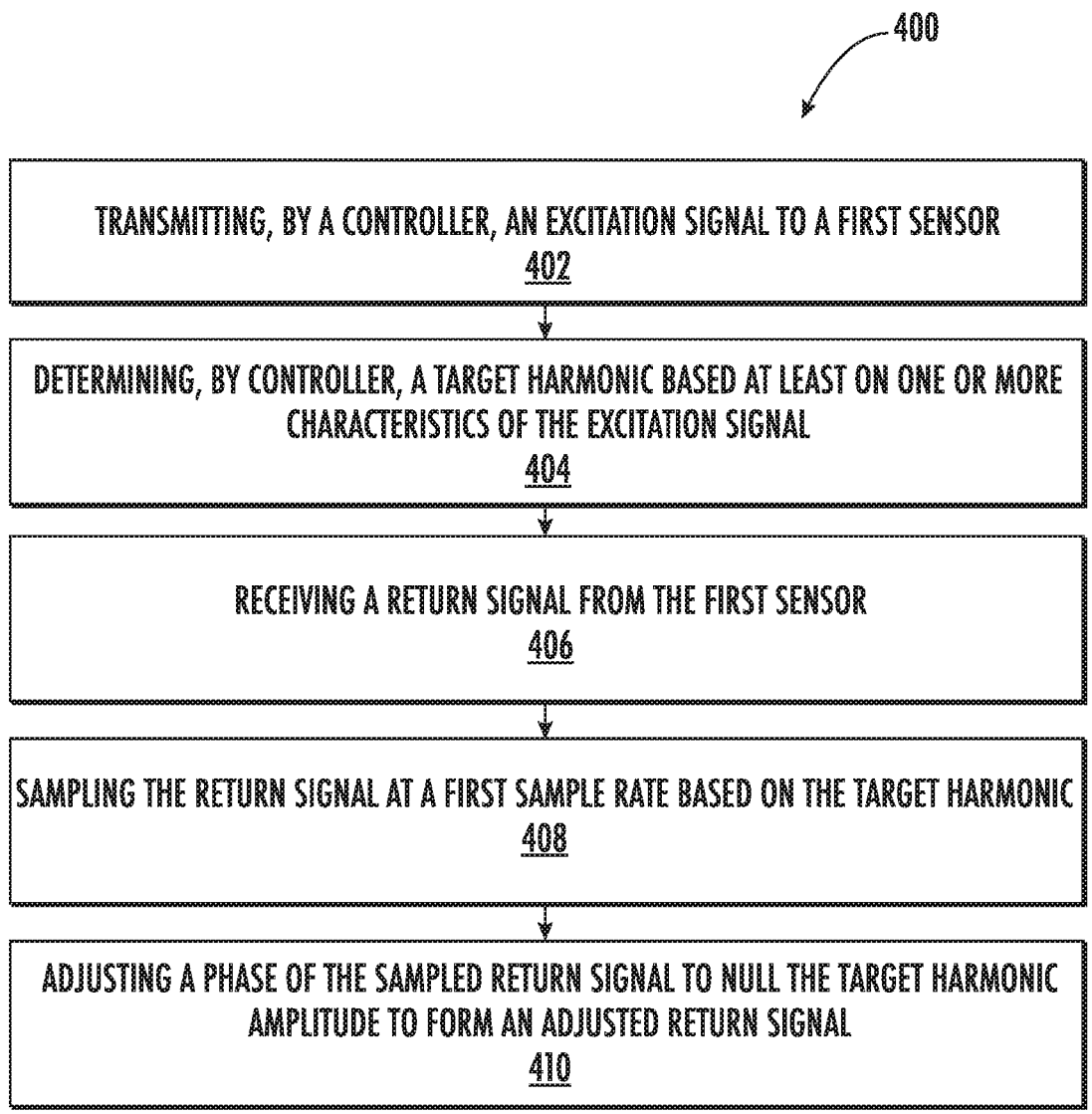
FIG. 4 depicts a flow diagram of a method for sinusoidal nulling according to one or more embodiments.

FIG. 4 depicts a flow diagram of a method for sinusoidal nulling according to one or more embodiments. The method 400 includes transmitting, by a controller, an excitation signal to a first sensor, as shown in block 402. At block 404, the method 400 includes determining, by the controller, a target harmonic based at least on one or more characteristics of the excitation signal. The method 400, at block 406, includes receiving a return signal from the first sensor. Also, the method 400 includes sampling the return signal at a first sample rate based on the target harmonic, as shown at block 408. And at block 410, the method 400 includes adjusting a phase of the sampled return signal to null the target harmonic amplitude to form an adjusted return signal Additional processes may also be included. It should be understood that the processes depicted in FIG. 4 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of 8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method for sinusoidal nulling, the method comprising:
   transmitting, by a controller, an excitation signal to a first sensor;
   determining, by the controller, a target harmonic based at least on one or more characteristics of the excitation signal, wherein the one or more characteristics of the excitation signal comprises a fundamental frequency;
   receiving a return signal from the first sensor;
   sampling the return signal at a first sample rate based on the target harmonic, wherein the target harmonic comprises an integer multiple of the fundamental frequency, and wherein the target harmonic is selected based on a determination of a dominant harmonic expected from the return signal from the first sensor; and
   adjusting a phase of the sampled return signal to null the target harmonic amplitude to form an adjusted return signal.

2. The method of claim 1, further comprising analyzing the adjusted return signal to determine sensor information associated with the first sensor.

3. The method of claim 1, wherein the first sample rate comprises a sample rate of two times a harmonic frequency of the target harmonic.

4. The method of claim 1, wherein the first sensor comprises at least one of an LVDT sensor, a resolver, and a proximity sensor.

5. The method of claim 1, wherein the target harmonic is determined based on a type of the first sensor.

6. A system for sinusoidal nulling, the system comprising:
   a controller communicatively coupled to a memory, the controller configured to:
      transmit an excitation signal to a first sensor;
      determine a target harmonic based at least on one or more characteristics of the excitation signal, wherein the one or more characteristics of the excitation signal comprises a fundamental frequency;
      receive a return signal from the first sensor;

sample the return signal at a first sample rate based on the target harmonic, wherein the target harmonic comprises an integer multiple of the fundamental frequency, and wherein the target harmonic is selected based on a determination of a dominant harmonic expected from the return signal from the first sensor; and adjust a phase of the sampled return signal to null the target harmonic amplitude to form an adjusted return signal.

7. The system of claim 6, wherein the controller is further configured to analyze the adjusted return signal to determine sensor information associated with the first sensor.

8. The system of claim 6, wherein the first sample rate comprises a sample rate of two times a harmonic frequency of the target harmonic.

9. The system of claim 6, wherein the first sensor comprises at least one of an LVDT sensor, a resolver, and a proximity sensor.

10. A computer program product for sinusoidal nulling, the computer program product comprising a non-transitory computer readable medium with instruction embedded therein, the instructions operable to cause a processor to perform:

transmitting an excitation signal to a first sensor;

determining a target harmonic based at least on one or more characteristics of the excitation signal, wherein the one or more characteristics of the excitation signal comprises a fundamental frequency;

receiving a return signal from the first sensor;

sampling the return signal at a first sample rate based on the target harmonic, wherein the target harmonic comprises an integer multiple of the fundamental frequency, and wherein the target harmonic is selected based on a determination of a dominant harmonic expected from the return signal from the first sensor; and adjusting a phase of the sampled return signal to null the target harmonic amplitude to form an adjusted return signal.

11. The computer program product of claim 10, further comprising analyzing the adjusted return signal to determine sensor information associated with the first sensor.

12. The computer program product of claim 10, wherein the first sample rate comprises a sample rate of two times a harmonic frequency of the target harmonic.

13. The computer program product of claim 10, wherein the first sensor comprises at least one of an LVDT sensor, a resolver, and a proximity sensor.

14. The computer program product of claim 10, wherein the target harmonic is determined based on a type of the first sensor.

* * * * *